Jan. 13, 1970 D. D. MILLER 3,489,207

VAPOR-COOLED ELECTRONICS ENCLOSURES

Filed Feb. 19, 1968 2 Sheets-Sheet 1

INVENTOR
DONALD D. MILLER

BY J. F. McDevitt
HIS ATTORNEY

Jan. 13, 1970 D. D. MILLER 3,489,207

VAPOR-COOLED ELECTRONICS ENCLOSURES

Filed Feb. 19, 1968

2 Sheets-Sheet 2

INVENTOR
DONALD D MILLER
BY J. T. McDevitt
HIS ATTORNEY

United States Patent Office 3,489,207

Patented Jan. 13, 1970

3,489,207

VAPOR-COOLED ELECTRONICS ENCLOSURES

Donald D. Miller, La Canada, Calif., assignor to General Electric Company, a corporation of New York Filed Feb. 19, 1968, Ser. No. 706,591
Int. Cl. F28d *15/00;* H01b *7/34;* H02b *1/00*
U.S. Cl. 165—105 9 Claims

ABSTRACT OF THE DISCLOSURE

A sealed container for electronic components is disclosed which is partially filled with a vaporizable heat exchange fluid to a level which covers the electronic components that give off most heat during operation and wherein electronic components giving off less heat are suspended in the container above the liquid level. Said latter components are spaced apart adjacent the side walls of the container to define a narrow space therebetween which is supplied with liquid when the container is tipped. The liquid contacts all major surfaces of the submerged electronic components and undergoes a boiling condensation cycle to effect heat removal.

Description of the invention

The present invention relates to a heat transfer apparatus for electronic components and more particularly to a sealed container wherein the electronic components are cooled by vaporization of a heat exchange liquid inside said container. Specifically, the present invention provides a vapor-cooled electronics enclosure having a sealed container which includes electronic components that are immersed in a heat exchange liquid for heat removal and temperature stabilization.

Various means are known to vapor-cool electronic components in a sealed container wherein the cooling is effected by boiling a heat exchange liquid in contact with the components and condensing the vapors upon heat exchange surfaces in the container. One such apparatus includes a separate expansion chamber for condensation of the vapors so as not to increase pressure on the cooling fluid. A different apparatus conducts the heat transfer cycle entirely within a sealed container which is partially filled with the liquid refrigerant and wherein vapor condenses on the container walls above the liquid level to maintain a controlled operating temperature of the electronic assembly. The cooling characteristics of the latter apparatus are determined by the volume of the container and the condensation surface area which in turn determines the pressure under which the cooling system operates. The cooling surface area of said container may be increased by the use of fins.

In the prior art apparatus, there is no provision for maintaining contact between the electronic components and the liquid heat exchange medium if the container is mounted upon a movable base. Overheating of said components will occur during operation if the level of heat removal is not maintained. For optimum heat removal it is also necessary to locate the heat generating electronic components in the liquid medium such that heat is removed by the liquid rather than utilizing the mounting means as a sheat sink member. From the standpoint of miniaturizing the electronics enclosure as much as possible, it is also desirable to orient the enclosed electronic components in the container to promote space saving.

Accordingly, a primary object of the present invention is to provide an improved vapor-cooled electronics enclosure which overcomes problems found in the prior art apparatus.

Another important object of the present invention is to provide improved means for mounting the primary heat generating electronic components in a container for vapor-cooling.

Still another important object of the invention is to orient electronic components in a vapor-cooled enclosure so as to maintain fluid contact when the enclosure is tipped.

Further objects and advantages of the present invention will become apparent from the following detailed description taken in connection with the accompanying drawings wherein.

Figure 1:
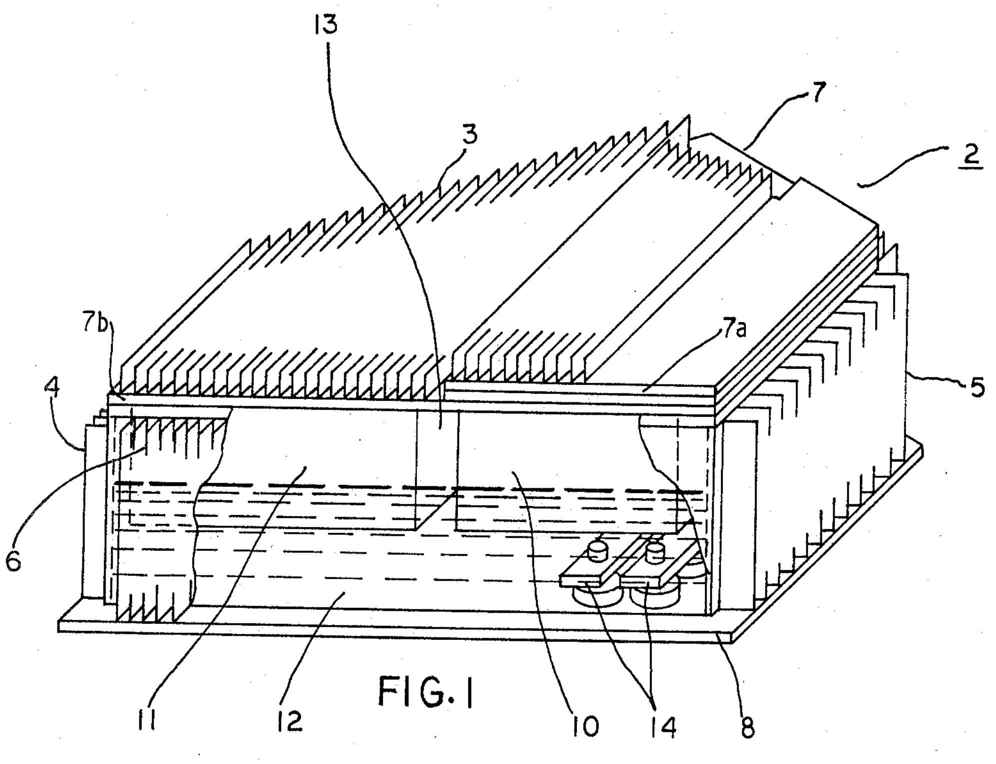
FIGURE 1 is an external view of an enclosure according to the invention having a portion of the front wall removed to expose the interior contents.

Briefly, the present invention is directed to an electronics enclosure having a sealed container with heat exchange surfaces on the exterior walls and which contains a plurality of heat-generating electronic components immersed in a vaporizable heat exchange liquid partially filling said container. Other electronic components that generate less heat are located in said container at least partially above the liquid level and are spaced apart to serve as dividers for said liquid when the entire unit is tipped. The submerged electronic components are suspended from a mounting member so that the heat exchange liquid is in direct contact with all major exterior surfaces of said components. Said mounting member can be fabricated from an electrically conductive material to provide a common lead for all suspended electrical components. Since the mounting member does not serve as the heat sink medium, it is unnecessary to consider its heat exchange characteristics and said member may be provided with means to isolate the fragile components from vibration and shock effects. Likewise, the electrical leads from said components may be fastened to the mounting member without regard to heat transfer considerations.

Electronic components suspended in the free space at least partially above the liquid level are spaced apart from the inside walls of the container so as to define a relatively narrow space therebetween. Liquid flows into these narrow spaces when the enclosure is tipped thereby maintaining an optimum heat transfer path to the walls of the container. An interior volume for the container will be selected which provides enough space for the components being suspended above the liquid level in the manner above described. The liquid level is sufficient to allow tipping of the electronics enclosure without exposing any of the totally submerged electronic components and is employed in a quantity for the particular container volume to boil at a temperature below the failure temperature of said components. By dividing up the free space in the container above the heat exchange liquid with lower heat-generating electronics components, the assembly can be operated in a number of different special positions without losing the liquid heat transfer path. Further packaging of the lower heat-generating electronic components in sealed envelopes helps division of the free space cavity by fixing the volume being occupied. Such packaging also facilitates repair and replacement of the electronic components.

Since the primary heat-generating electronic components are totally submerged in the heat exchange liquid it becomes necessary to select liquids which are electrical dielectrics. Fortunately, numerous dielectric liquids are available which can be selected based upon having stable boiling points at the superatmospheric operating pressures in the container below failure temperature of the electronic components. It is also essential that the selected heat exchange liquid does not corrode or otherwise chemically react to any significant degree with the submerged electronic components and it is desirable to select a liquid which is non-inflammable and non-toxic. Liquid refrigerants such as fluorinated hydrocarbons and methylene chloride are preferred heat exchange fluids from heat transfer considerations and meet all the other above specified criteria. Many other suitable liquids can be selected dependent upon the operating temperature range of the assembly and if the assembly is to be operated in a vehicle it may become necessary to consider the freezing point of the liquid selected.

The primary heat-generating electronic components are spaced apart from the mounting member to facilitate heat removal therefrom in the boiling liquid. The preferred embodiment for a mounting member shown in FIGURE 2 suspends the electronic components in the liquid with fastening means that extend below the member. Use of a projected suspension provides contact of the heat exchange liquid with all exterior surfaces of the components and does not trap bubbles formed when the liquid boils. If the bubbles do not escape, localized hot spots are produced which can cause electrical or mechanical failure of the adjacent electronic components. A liquid heat transfer path is maintained for the submerged components by using a plurality of mounting members which are suitably spaced apart in the container. The above described orientation of primary heat generating components also facilitates repair and maintenance of the entire assembly. Surprisingly, such a unit employing power transistors as the primary heat generating electronic components exhibited a large decrease in thermal resistance when power dissipation was increased.

Referring now to the specific constructions shown in the accompanying drawings, FIGURE 1 is an external view of electronics enclosure 2 having exterior walls which include heat transfer surfaces 3, 4, 5 and 6. Said enclosure has a base member 8 designed to be mounted by conventional means to a movable base (not shown) in an upright spatial orientation. More particularly, the particular embodiment shown is designed for horizontal orientation with respect to the ground plane although, as will be apparent in a later embodiment, the unit can be designed for mounting in other spacial planes. Said enclosure is in the shape of a container having cover member 7 which is of a split opening construction to permit separate removal of cover elements 7*a* and 7*b*. A unitized package of electronic components 10 is suspended from the cover frame of the enclosure to define a narrow space with the interior wall members. Removal of cover element 7*a* provides access to the electronic components housed in the unitized package 10. Likewise, a second package of electronic components 11 is suspended in the enclosure spaced apart from the first package to further divide the internal cavity. Cover element 7*b* provides separate access to the second package of components. The lower portion of the internal container cavity is filled with a heat exchange liquid 12 leaving a free space 13 for liquid vapors. The primary heat-generating electronic components are suspended from mounting members 14 in the liquid.

In operation, heat generated by the primary electronic components causes the liquid to boil whereupon liquid vapors occupy the free space in the internal cavity. Said liquid vapors condense upon the interior walls of the enclosure to form droplets which flow downwardly and rejoin the liquid mass. A continuous heat transfer cycle is thereby provided which does not require external regulation. Additional heat removal is achieved by conduction through the liquid which is maintained in physical contact with the primary heat generating electronic components. Such cooperative heat removal action promotes greater miniaturization of the enclosure than might otherwise be obtained.

Figure 2:
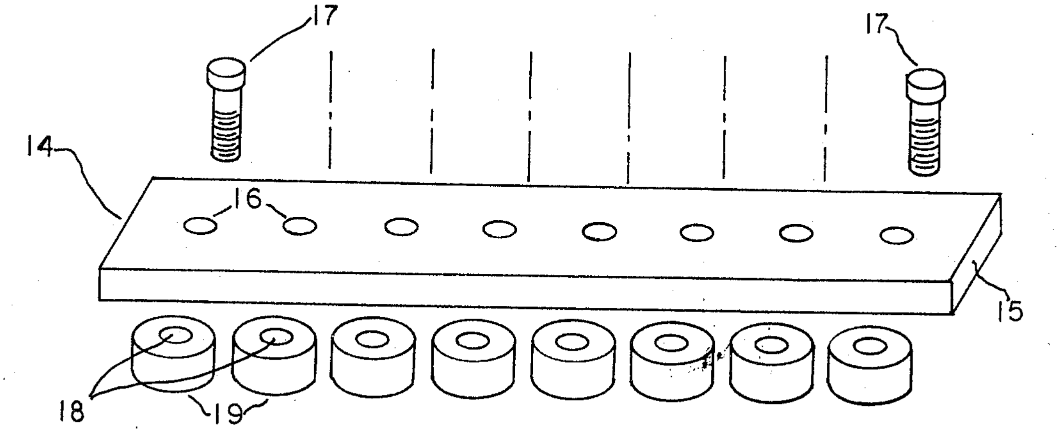
FIGURE 2 is a preferred mounting means for the heat-generating electrical components depicted in FIGURE 1.

FIGURE 2 illustrates a preferred mounting member 14 for suspending the primary heat generating electronic components in the container. Said member comprises an elongated body element 15 having holes 16 therein for threaded studs 17. Said studs extend far enough beyond the body of the mounting member to provide liquid contact with the liquid with all sides of the suspended electronic components. A threaded opening 18 is provided in each of said electronic components 19 for suspension from the studs. Electrical connection to said components can be provided by selection of electrically conductive materials for the studs to include the body element if the particular use application requires common electrical termination. For example, a parallel power transistor circuit can be arranged having one electrode for each component electrically connected to the body member with separate electrical buses being provided for common connection of the remaining electrodes. Since the thermal characteristics of the mounting member are not relied upon to remove heat it also becomes possible to utilize optimum techniques to isolate the suspended components from mechanical shock and vibration. Elastomeric materials can thereby be utilized as shock mounts for the fragile leads of the components without sacrifice in heat removal.

Figure 3:
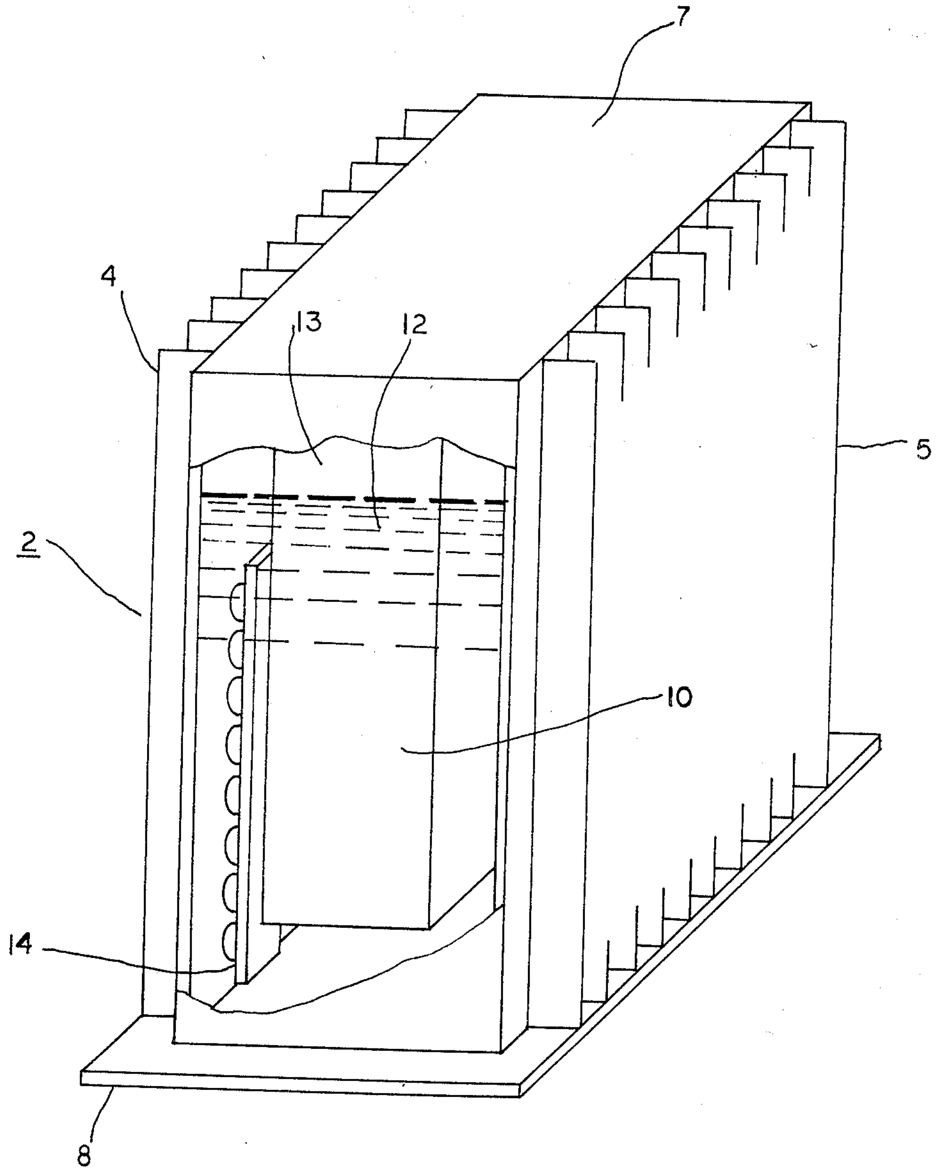
FIGURE 3 is a different preferred embodiment for the enclosure of the invention.

FIGURE 3 is an external view of a different electronics enclosure of the invention. For clarity of understanding, the same numerals are used to identify common structural elements described for the FIGURE 1 embodiment. Accordingly electronics enclosure 2 is in the form of a sealed container having side walls which include heat transfer surfaces 4 and 5, cover 7 and base 8. An electronics package 10 is suspended inside said container in the free space 13 above the level of heat exchange liquid 12. Said electronics package defines a narrow space with the interior walls of said container means to provide heat removal by a fluid path when the enclosure is tipped. A mounting member 14 for the primary heat-generating electronic components is also located adjacent one container wall and submerged in the heat exchange liquid. Heat removal proceeds from said enclosure in the same manner hereinbefore described for the FIGURE 1 embodiment. Location of the primary heat-generating electronic components along a side wall of the enclosure permits removal for repair or replacement without disturbing the remaining electronic elements.

It will be apparent from the foregoing description that a generally improved electronics enclosure has been provided. It is not intended to limit the present invention to the preferred embodiments above shown, however, since certain modifications of the present teachings can be made without departing from the true spirit and scope of the invention. As previously pointed out, it is contemplated for certain applications wherein said enclosure is exposed to significant mechanical shock such as in a vehicle to isolate fragile components from damage by using known cushioning techniques. It is intended to limit the present invention, therefore, only to the scope of the following claims.

What I claim is new and desired to be secured by Letters Patent in the United States is

1. A vapor-cooled electronics enclosure comprising:
(a) A sealed container with heat exchange surfaces on the exterior walls and containing a plurality of heat generating electronic components immersed in a vaporizable heat exchange liquid partially filling said container;
(b) Other lower heat-generating electronic components occupying a major portion of the free space above the level of the heat exchange liquid in said container and being spaced apart defining relatively narrow spaces therebetween. to serve as dividers for said liquid when the container is tipped; and
(c) A mounting member for the primary heat generating electronic components whereby heat exchange liquid is in direct contact with all heat dissipating surfaces of each component.

2. A vapor-cooled electronics enclosure as in claim 1 wherein the lower heat-generating components are enclosed in a sealed envelope.

3. A vapor-cooled electronics enclosure as in claim 1 wherein the mounting means for the primary heat generating electronic components is an electrical conductor and said components are electrically connected thereto.

4. A vapor-cooled electronic enclosure as in claim 1 wherein the heat exchange surfaces are cooling fins.

5. A vapor-cooled electronics enclosure as in claim 1 wherein the heat exchange liquid is dielectric having a boiling point below a temperature at which the enclosed electronic components can be damaged.

6. A vapor-cooled electronics enclosure as in claim 1 wherein the sealed container has side walls incorporating the heat exchange surfaces which extend upwardly from a base and the primary heat-generating electronic components are disposed adjacent said base.

7. A vapor-cooled electronics enclosure as in claim 1 wherein the sealed container has side walls incorporating the heat exchange surfaces which extend upwardly from a base and the primary heat-generating electronic components are disposed adjacent one side wall.

8. A vapor-cooled electronics enclosure as in claim 6 wherein the primary heat-generating electronic components are suspended from the mounting member by fastening means which project from the body of said member and said electronic components are electrically interconnected by bus means.

9. A vapor-cooled electronics enclosure as in claim 7 wherein the primary heat-generating electronic components are suspended from the mounting member by fastening means which project from the body of said member and said electronic components are electrically interconnected by bus means.

References Cited

UNITED STATES PATENTS

| | | | |
|---|---|---|---|
| 2,288,341 | 6/1942 | Addink | 317—234 X |
| 2,886,746 | 5/1959 | Saby | 165—105 X |
| 3,091,722 | 5/1963 | Borowiec et al. | 317—100 |
| 3,145,357 | 8/1964 | Gettino et al. | 336—58 X |
| 3,301,315 | 1/1967 | Webb | 165—80 X |

FOREIGN PATENTS

| | | |
|---|---|---|
| 1,005,539 | 9/1965 | Great Britain. |

ROBERT A. O'LEARY, Primary Examiner

A. W. DAVIS, Assistant Examiner

U.S. Cl. X.R.

174—15; 317—100, 234